United States Patent [19]

Hsu

[11] Patent Number: 5,712,203
[45] Date of Patent: Jan. 27, 1998

[54] PROCESS FOR FABRICATING READ-ONLY MEMORY CELLS USING REMOVABLE BARRIER STRIPS

[75] Inventor: Chen-Chung Hsu, Taichung, Taiwan

[73] Assignee: United Microelectronics Corporation, Hsinchu, Taiwan

[21] Appl. No.: 570,340

[22] Filed: Dec. 11, 1995

[51] Int. Cl.$^6$ ............................................. H01L 21/8246
[52] U.S. Cl. .................. 438/275; 438/587; 438/981; 148/DIG. 163
[58] Field of Search ........................ 438/275, 279, 438/586, 587, 591, 692, 981, 111, 177, 193, 208, 490; 148/DIG. 163

[56] References Cited

U.S. PATENT DOCUMENTS

| | | | |
|---|---|---|---|
| 5,240,873 | 8/1993 | Shinji | 438/587 |
| 5,429,988 | 7/1995 | Huang et al. | 438/587 |
| 5,460,997 | 10/1995 | Hawkins et al. | 438/587 |
| 5,504,030 | 4/1996 | Chung et al. | 438/981 |
| 5,571,739 | 11/1996 | Hong | 438/981 |
| 5,576,573 | 11/1996 | Su et al. | 438/981 |
| 5,597,753 | 1/1997 | Sheu | 438/275 |
| 5,633,187 | 5/1997 | Hsu | 438/275 |

Primary Examiner—Charles L. Bowers, Jr.
Assistant Examiner—Leon Radomsky
Attorney, Agent, or Firm—Cushman Darby & Cushman IP Group of Pillsbury Madison & Sutro LLP

[57] ABSTRACT

A process for fabricating memory cells of a read-only memory (ROM) device is disclosed. First, a silicon dioxide layer and a silicon nitride layer are successively formed on the surface of a silicon substrate. These layers are patterned by etching to form a plurality of parallel barrier strips extending along a first direction on the surface of the substrate. Impurities are then implanted into the silicon substrate by using the barrier strips as masks, to form a plurality of buried bit lines in the areas between the barrier strips. Next, insulating sidewall spacers are formed on the sidewalls of the barrier strips. A metal silicide layer is then formed over the exposed surface of the buried bit lines in a self-aligned process. A thick dielectric layer is then formed overlying the barrier strips, the insulating sidewall spacers, and the metal silicide layer. The upper portions of the thick dielectric layer, the insulating sidewall spacers, and the silicon nitride layer are then polished to form a planar surface. Thereafter, portions of the barrier strips that cover the designated coding regions of the memory cells are removed to expose the silicon substrate. A gate oxide layer is formed on the exposed surface of the silicon substrate. Finally, a conducting layer is formed overlying the entire substrate surface. The conducting layer is then patterned by etching to form a plurality of strip-shaped word lines of the memory cells extending along a second direction which is substantially orthogonal to the first direction.

8 Claims, 4 Drawing Sheets

PROCESS FOR FABRICATING READ-ONLY MEMORY CELLS USING REMOVABLE BARRIER STRIPS

BACKGROUND OF THE INVENTION

1. Field of the Invention

The present invention relates in general to a process for fabricating semiconductor devices. In particular, the present invention relates to a process for fabricating semiconductor read-only memory cells by employing a thick nitride layer on designated channel regions of the cells and between the gate electrode and the gate oxide layer to turn them off while leaving other cells in the conducting state.

2. Description of Related Art

Conventional ROM device memory cells use channel transistors as the electric charge storage components, which are selectively implanted with impurities into the designated channel regions in the process of data programming. The purpose of this selective impurity implantation is to change the threshold voltage of those "programmed" memory cells, so that the memory cell transistor may be controlled in either the ON or OFF state to represent the binary bits one and zero respectively, or zero and one respectively depending on the memory cell supporting logic design.

A brief description of the manufacturing process of a conventional ROM device helps explain the present invention. FIG. 1 (PRIOR ART) of the accompanying drawing shows the top view of a conventional ROM device which exhibits the configuration of several memory cells as observed from above. A cross-sectional view of the conventional ROM device memory cells taken along the II—II line is shown in FIG. 2 (PRIOR ART) and provides the details of the cells from another perspective.

As is shown in the drawing, a number of memory cells of the conventional ROM device are fabricated on a silicon substrate 10 of, for example, P-type. $N^+$ source/drain regions (which become bit lines 14) are formed in the designated locations of the silicon substrate 10. The top view of FIG. 1 (PRIOR ART) shows that the $N^+$ source/drain regions (which become bit lines 14) are formed as long strips extending in one direction, namely, the vertical direction in the drawing which serve as the bit lines for the memory cells of the ROM device. A gate oxide layer 12 is then formed over the surface of the silicon substrate 10, and on top of which, gate electrodes (which become word lines 16) are formed to constitute the word lines for the memory cells in the ROM device. The word lines 16 are, as is shown in the top view of FIG. 1 (PRIOR ART), also formed as long strips that extend in the direction substantially orthogonal to the extending direction of the bit lines 14. In this example, the word lines 16 extend in the horizontal direction in FIG. 1 (PRIOR ART). Channel regions 18 for the memory cell transistors are formed between every two consecutive bit lines 14 and under each word line 16. The status of either conducting or blocking of each of the memory cell transistor determines its memory content of either binary one or zero (or either zero or one) respectively.

A ROM device having the basic memory cells as described above has all the memory cell transistors turned on, or, in other words, in their conducting state unless they have been programmed with data. To turn off a selected memory cell transistor, its channel region 18 would have to be implanted with P-type impurities. The process of programming the data bits into the selected memory cells of the ROM device is a process referred to as "code implantation". Those memory cell transistors with their channel regions implanted with P-type impurities will have increased threshold voltage in the channel region.

However, such ROM devices having the memory cell configuration as described above have at least two disadvantages. To achieve high integration density, it is necessary to reduce the size of virtually every dimension in a device such as a ROM. As memory cells are increasingly miniaturized, it is inevitable that the width of the word lines for the memory cells must also be reduced. However, reducing the width of word lines 16 increases its electrical resistance over its cross section, resulting in the reduction of memory access speed. Furthermore, code implantation is a relatively inaccurate procedure when considering the dimensional reduction of the memory cell transistors. Excessive diffusion of the implants in the designated channel region, as well as implantation location shifting constitute the primary problems of these conventional ROM devices. The typical operating characteristics exhibited by such faulty memory cells include typical electric current leakage, or a lower breakdown voltage.

SUMMARY OF THE INVENTION

It is therefore an object of the present invention to provide a process for fabricating ROM device memory cells having reduced bit line electrical resistance to improve the device access speed.

It is another object of the present invention to provide a process for fabricating memory cells of a ROM device that requires no ion implantation procedure in programming the ROM device to avoid implantation diffusion and misalignment, as well as premature voltage breakdown.

The present invention achieves these objects by providing a novel process for fabricating memory cells of a read-only memory (ROM) device. First, a silicon dioxide layer and a silicon nitride layer are successively formed on the surface of a silicon substrate. The stacked layers of silicon dioxide and silicon nitride are patterned by etching to form a plurality of parallel barrier strips extending along a first direction on the surface of the silicon substrate. Impurities are then implanted into the silicon substrate by using the barrier strips as the masks, so as to form a plurality of buried bit lines of the memory cells in the areas between the barrier strips. Next, insulating sidewall spacers are formed on the sidewalls of the barrier strips. A metal silicide layer is then formed over the exposed surface of the buried bit lines in a self-aligned process, thereby improving the electrical conductivity of the buried bit lines. After that, a thick dielectric layer is formed overlying the barrier strips, the insulating sidewall spacers, and the metal silicide layer. The upper portions of the thick dielectric layer, the insulating sidewall spacers, and the silicon nitride layer are then polished to form a planar surface. Thereafter, portions of the barrier strips that cover the designated coding regions of the memory cells are removed to expose the silicon substrate. A gate oxide layer is formed on the exposed surface of the silicon substrate. Finally, a conducting layer is formed overlying the entire substrate surface. The conducting layer is then patterned by etching to form a plurality of strip-shaped word lines of the memory cells extending along a second direction which is substantially orthogonal to the first direction. Therefore, when applying a certain operating voltage, memory cells containing the gate oxide layer are conductive, i.e. in the "ON" state, while the remaining memory cells without the gate oxide layer are blocked, i.e. in the "OFF" state.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
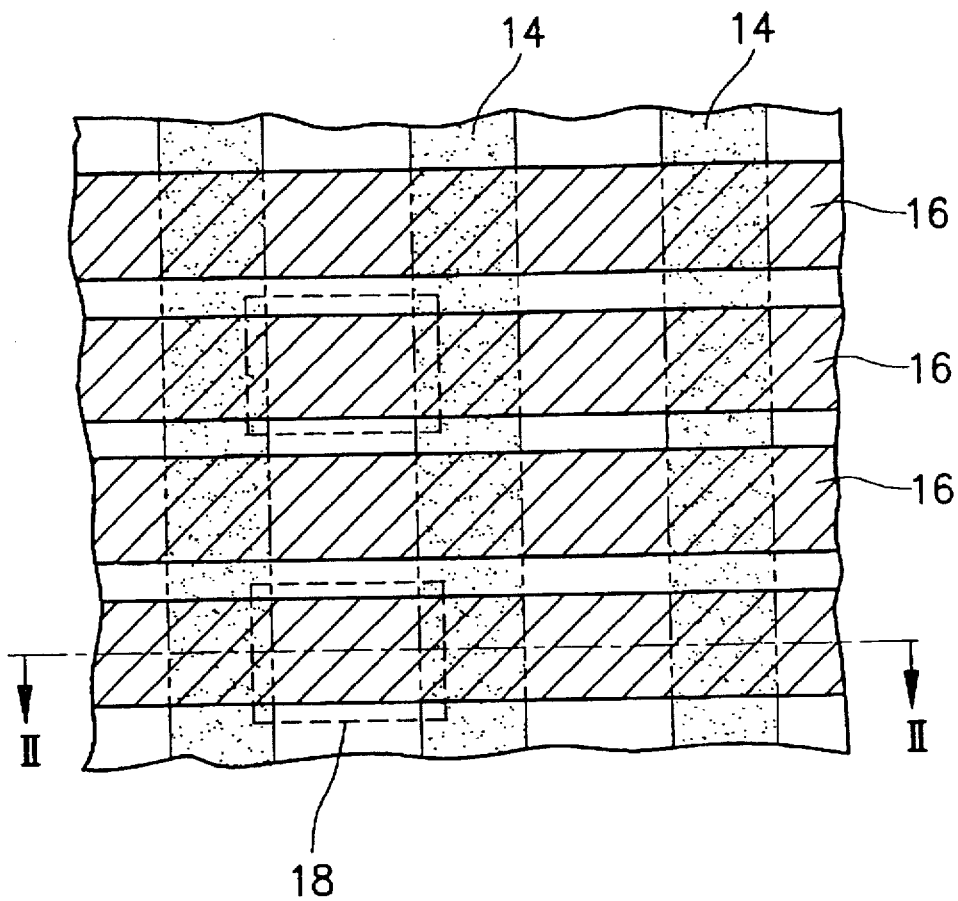
FIG. 1 (PRIOR ART) is a top view of a conventional ROM device showing the configuration of the memory cells.
Figure 2:
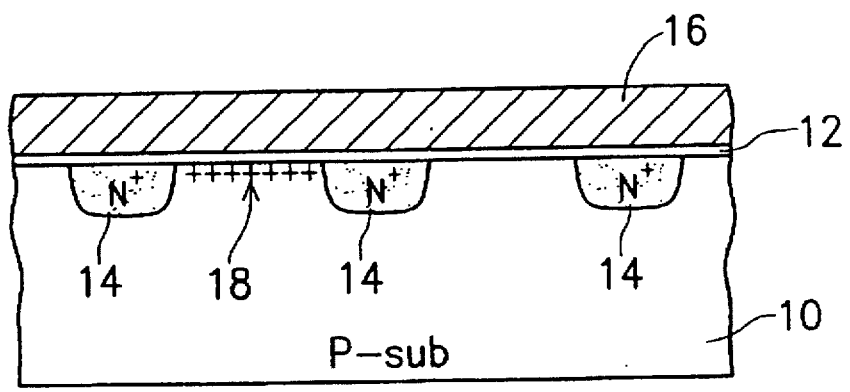
FIG. 2 (PRIOR ART) is a cross-sectional view of the memory cells of FIG. 1 (PRIOR ART) as taken along the II—II line thereof.
Figure 3:
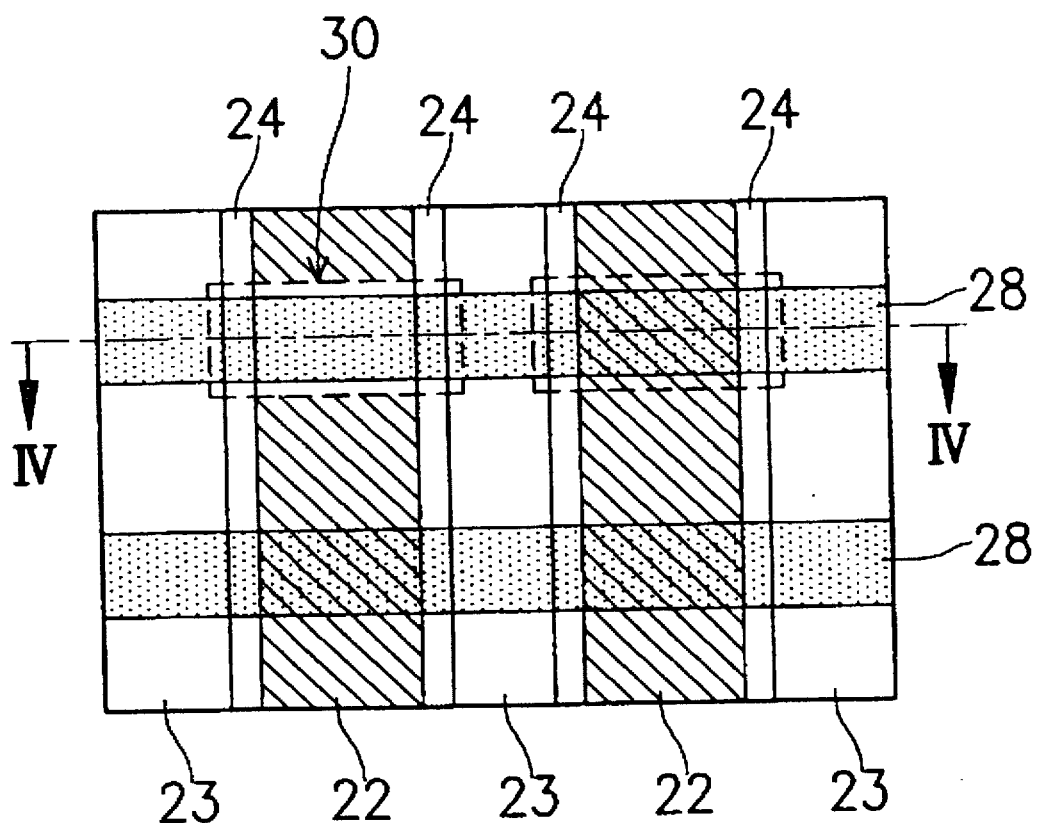
FIG. 3 is a top view of a ROM device fabricated in accordance with a preferred embodiment of the present invention showing the configuration of the memory cells.
Figure 4A:
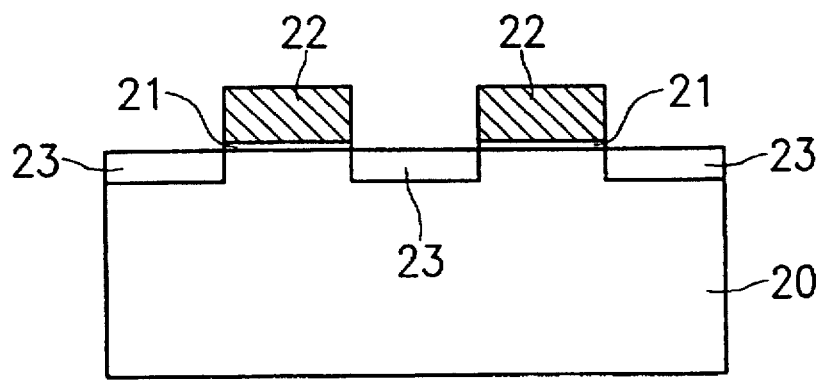
FIGS. 4A–4F are cross-sectional views taken along the IV—IV line of FIG. 3 showing various stages of fabrication in accordance with the present invention.

First, referring to both FIG. 3 and FIG. 4A, a semiconductor substrate, for example, a P-type silicon substrate 20 is provided for fabricating a ROM device according to the present invention. A silicon dioxide layer 21 is formed on the surface of the P-type silicon substrate 20. This can be accomplished using a thermal oxidation procedure, or a chemical vapor deposition (CVD) procedure, or any other suitable technique. A silicon nitride layer 22 is formed on the surface of the silicon dioxide layer 21. This can be done by, for example, a CVD procedure, or any other suitable technique. Photolithography and etching are then employed to define the patterns of the silicon nitride layer 22 and the silicon dioxide layer 21, thereby forming a plurality of parallel barrier strips extending along a first direction on the surface of the silicon substrate 20, as shown in the cross-sectional view of FIG. 4A.

Then, the barrier strips are utilized as the masks for an ion implantation procedure that brings impurities, for example, arsenic ions into a controlled depth of the silicon substrate 20. This forms a plurality of buried bit lines 23 in the substrate 20 between every adjacent pair of two barrier strips. Ion implantation can be performed at an energy level of about 50 to 100 KeV, with a dosage of about $10^{14}$ to $10^{16}$ atoms/cm$^2$.

Figure 4B:
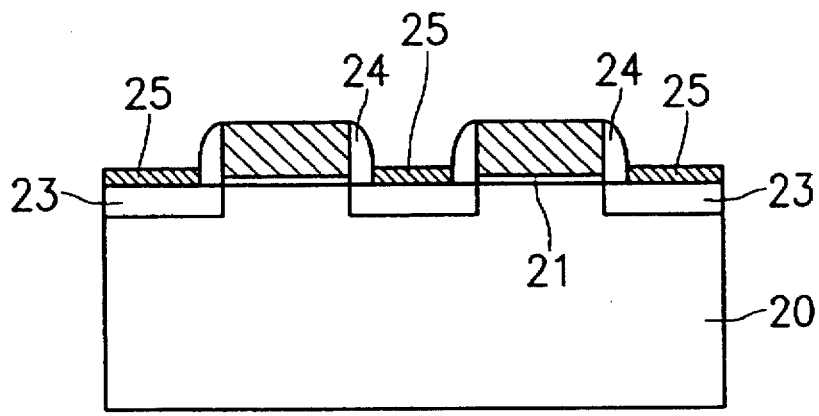

Referring next to both FIG. 3 and FIG. 4B, insulating sidewall spacers 24 are then formed on the sidewalls of the barrier strips that include the silicon dioxide layer 21 and the silicon nitride layer 22. The insulating sidewall spacers 24 may be formed by, for example, depositing a layer of silicon dioxide and then performing reactive ion etching (RIE) to etch back the deposited silicon dioxide layer. The result is the formation of the silicon dioxide sidewall spacers 24, as is shown in FIG. 4B.

A metal silicide layer, for example, titanium silicide layer 25 is then formed to cover the exposed surface of the buried bit lines 23 in a self-aligned procedure, so as to improve the electrical conductivity thereof. This may be achieved by, for example, by sputtering to deposit a layer of titanium to a thickness of about 300 Å to 800 Å over the surface of both the sidewall spacers 24 and the buried bit lines 23 as well as the barrier strips. Thereafter, thermal annealing is carried out at a temperature of about 600° to 900° C. This allows the surface of the buried bit lines 23 to react with the titanium layer, thereby forming the titanium silicide layer 25. Only a portion of the thickness of the sputtered titanium layer covering the surface of the exposing buried bit lines 23 reacts to form the titanium silicide layer during the thermal annealing procedure. After the formation of the titanium silicide layer 25, all those portions of the pure titanium layer are then removed.

Figure 4C:
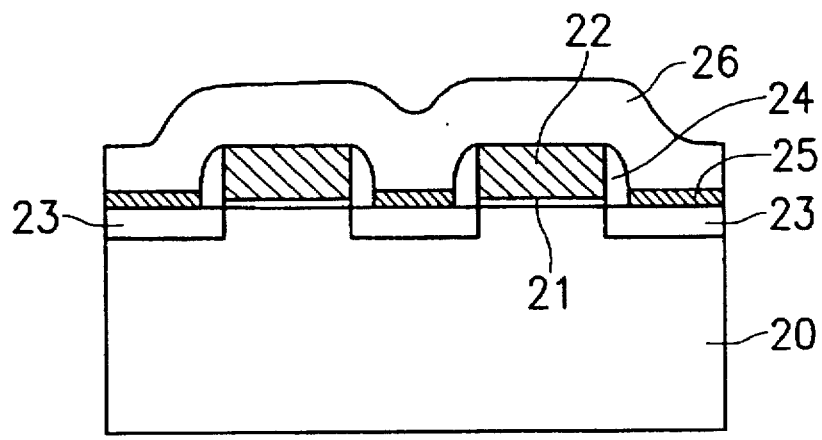
Figure 4D:
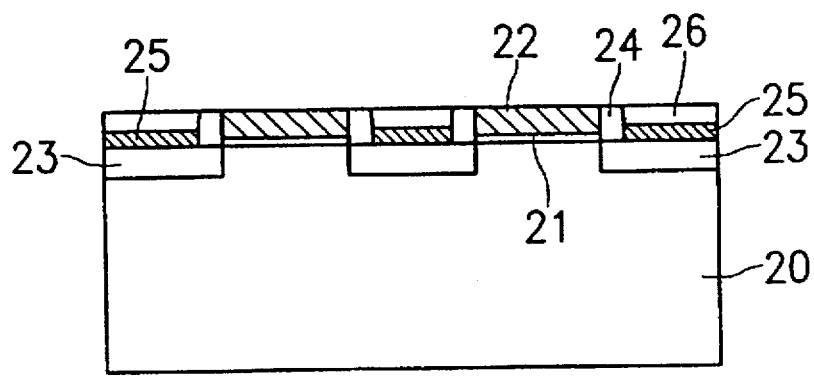

Referring next to FIG. 4C, a thick dielectric layer 26 is formed overlying the surface of the above mentioned layers. This can be achieved by performing a CVD procedure, for example, to form a silicon dioxide layer with a thickness of between 5000 Å to 8000 Å. The upper portions of the thick dielectric layer 26, the insulating sidewall spacers 24, and the silicon nitride layer 22 are then polished to form a planar surface by, for example, a chemical mechanical polishing (CMP) procedure. The resulting configuration is shown in FIG. 4D.

Figure 4E:
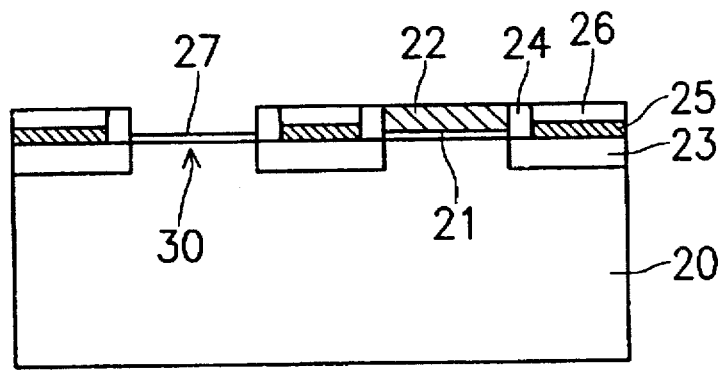

Referring next to both FIG. 3 and FIG. 4E, a photoresist layer (not shown in the drawing) is coated and patterned to define the coding region 30 for those memory cells according to the desired program. Then, the photoresist layer is utilized as the mask for an etching procedure that removes portion of the barrier strips (of the silicon dioxide layer 21 and the silicon nitride layer 22) within the scope of the coding region 30, thereby exposing the surface of the silicon substrate 20. After that, the photoresist layer is removed. A gate oxide layer 27 with a thickness of between 50 Å to 200 Å is then formed on the exposed surface of the silicon substrate 20 by, for example, a CVD procedure.

Figure 4F:
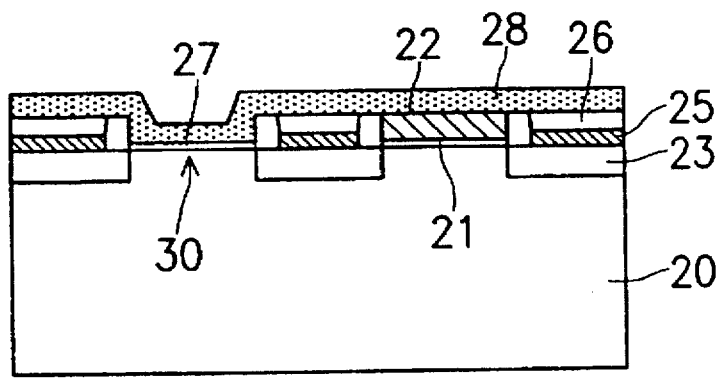

Referring now to both FIG. 3 and FIG. 4F, a conducting layer is then formed on the entire surface of the substrate construction at this stage. This can be achieved by, for example, depositing a polysilicon layer with a thickness of between 2000 Å to 5000 Å. A photolithography procedure is then employed to define the pattern of the polysilicon layer to form a plurality of parallel strip-shaped word lines 28 that extend along a direction orthogonal to the direction of the bit lines 23.

This generally concludes the process of fabricating the memory cells for the ROM device of the present invention, with the memory contents programmed. Comparing the top view of FIG. 3 with the cross-sectional view of FIG. 4F shows that the intersecting area of a word line 28 and a pair of consecutive buried bit lines 23 is the location for a memory cell of the ROM device, as is identified by the phantom lines in the top view of FIG. 3. When applying a predetermined operating voltage, memory cells within the coding region 30 that contain the gate oxide layer 27 are conductive, i.e. in the "ON" state, while the remaining memory cells without the gate oxide layer 27 are blocked, i.e. in the "OFF" state. With the selective "ON" and "OFF" states of the memory cells, the ROM device of the present invention my be "programmed" as is needed for different code/date requirements.

The semiconductor structural configuration of the memory cells for the ROM device of the present invention as depicted in the cross-sectional view of FIG. 4F, as well as in the top view of FIG. 3, may then be subjected to the steps that fabricate components such as metal interconnects and passivation layers to conclude the fabrication of a complete ROM device. All these post processing steps which do not concern the scope of the present invention should be well known by persons skilled in this art, and will therefore not be described herein.

ROM device memory cells, constructed in accordance with the principles of the present invention, feature the titanium silicide layer 25 to reduce the electrical resistance in the buried bit lines 24, which results in the improvement in the operating speed of the memory cells. Furthermore, because no ion implantation procedure is required during the coding procedure of the present invention, the conventional problems of programming implantation diffusion and misalignment, together with premature voltage breakdown are not experienced.

As persons skilled in this art may well appreciate, the above description of the preferred embodiment of the present invention is employed for the purposes of description, not to restrict the scope of the present invention. Modifications to the outlined embodiment of the present invention may be apparent and should be considered to be within the scope of the present invention which is recited in the claims that follow.

What is claimed is:

1. A process for fabricating memory cells of a read-only memory device comprising the steps of:

successively forming a silicon dioxide layer and a silicon nitride layer on the surface of a silicon substrate, and patterning the layers of silicon dioxide and silicon nitride to form a plurality of parallel barrier strips extending along a first direction on the surface of the silicon substrate;

selectively implanting impurities into the silicon substrate within the areas between the barrier strips, constituting a plurality of buried bit lines of the memory cells;

forming insulating sidewall spacers on the sidewalls of the barrier strips;

forming a metal silicide layer over the exposed surface of the buried bit lines in a self-aligned process to improve the electrical conductivity of the buried bit lines;

forming a thick dielectric layer overlying the barrier strips, the insulating sidewall spacers, and the metal silicide;

polishing the upper portions of the thick dielectric layer, the insulating sidewall spacers, and the silicon nitride layer to form a planar surface;

removing designated portions of the barrier strips to expose the surface of the silicon substrate for coding regions of the read-only memory device;

forming a gate oxide layer on the exposed silicon substrate within the areas for the coding regions;

forming a conducting layer overlying the surface of the barrier strips, the insulating sidewall spacers, the thick dielectric layer, and the gate oxide layer; and patterning the conducting layer to form a plurality of parallel strip-shaped word lines extending along a second direction substantially orthogonal to the first direction.

2. A process according to claim 1, wherein the step of selectively implanting impurities to form buried bit lines comprises the step of implanting arsenic ions at an implantation energy level of about 50 to 100 KeV and a dosage of about $10^{14}$ to $10^{16}$ atoms/cm$^2$.

3. A process according to claim 1, wherein the step of forming insulating sidewall spacers on the sidewalls of the barrier strips comprise the step of forming the insulating sidewall spacers from silicon dioxide.

4. The process for fabricating memory cells of a read-only memory device according to claim 1, wherein the step of forming the metal silicide layer comprises the steps of:

sputtering a layer of titanium to a thickness of about 300 Å to 800 Å covering the surface of the barrier strips, the insulating sidewall spacers, and the buried bit lines;

annealing at a temperature of about 600° to 900° C., thereby causing a portion of the titanium layer over the buried bit lines to react with the buried bit lines to form a titanium silicide layer;

removing the remaining portion of the titanium layer which is not converted into the titanium silicide layer.

5. A process according to claim 1, wherein the step of forming the thick dielectric layer comprises the step of forming a silicon dioxide layer with a thickness of between 5000 Å and 8000 Å.

6. A process according to claim 1, wherein the polishing step comprises the step of polishing using a chemical mechanical polishing (CMP) procedure.

7. A process according to claim 1, wherein the step of forming a gate oxide layer comprises the step of forming a gate oxide layer having a thickness of between 50 Å and 200 Å.

8. A process according to claim 1, wherein the step of forming a conducting layer comprises the step of forming a conducting layer of polysilicon having a thickness of between 2,000 Å and 5,000 Å.

* * * * *